US008785925B2

(12) United States Patent
Takechi

(10) Patent No.: US 8,785,925 B2
(45) Date of Patent: Jul. 22, 2014

(54) THIN FILM DEVICE

(75) Inventor: Kazushige Takechi, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 0 days.

(21) Appl. No.: 13/571,966

(22) Filed: Aug. 10, 2012

(65) Prior Publication Data
US 2013/0037797 A1    Feb. 14, 2013

(30) Foreign Application Priority Data

Aug. 12, 2011   (JP) ................ 2011-177305

(51) Int. Cl.
H01L 29/786    (2006.01)
H01L 29/45     (2006.01)

(52) U.S. Cl.
USPC ............ 257/43; 257/E29.296; 257/E29.273

(58) Field of Classification Search
None
See application file for complete search history.

(56) References Cited

U.S. PATENT DOCUMENTS

| 6,794,682 | B2* | 9/2004 | Watanabe et al. | 257/72 |
| 7,638,360 | B2* | 12/2009 | Ryu et al. | 438/104 |
| 8,236,635 | B2 | 8/2012 | Suzawa et al. | |
| 8,298,877 | B2* | 10/2012 | Choi et al. | 438/149 |
| 8,349,647 | B2* | 1/2013 | Ryu et al. | 438/104 |
| 8,426,852 | B2* | 4/2013 | Lee et al. | 257/43 |
| 2008/0283831 | A1* | 11/2008 | Ryu et al. | 257/43 |
| 2008/0296568 | A1* | 12/2008 | Ryu et al. | 257/43 |
| 2010/0105162 | A1* | 4/2010 | Suzawa et al. | 438/104 |
| 2010/0308334 | A1* | 12/2010 | Choi et al. | 257/59 |
| 2011/0114940 | A1* | 5/2011 | Kim et al. | 257/43 |
| 2011/0133176 | A1* | 6/2011 | Lee et al. | 257/43 |
| 2012/0228604 | A1* | 9/2012 | Choi et al. | 257/43 |

FOREIGN PATENT DOCUMENTS

| JP | 2009-260378 | 11/2009 |
| JP | 2010-056539 | 3/2010 |
| JP | 2010-056542 | 3/2010 |
| KR | 2010-0045926 | 5/2010 |
| TW | 201142952 | * 12/2011 |

OTHER PUBLICATIONS

Park, Jin-Seong, Jae Kyeong Jeong, Yeon-Gon Mo, Hye Dong Kim, and Sun-Il Kim. "Improvements in the Device Characteristics of Amorphous Indium Gallium Zinc Oxide Thin-film Transistors by Ar Plasma Treatment." Applied Physics Letters 90.26 (2007): 262106.*
Zheng Yanbin et al 2012 Plasma Sci. Technol. 14 915.*

(Continued)

Primary Examiner — Davienne Monbleau
Assistant Examiner — Joseph Schoenholtz
(74) Attorney, Agent, or Firm — Young & Thompson

(57) ABSTRACT

There is such an issue with a TFT using an oxide semiconductor film that oxygen deficit is generated in a surface region of the oxide semiconductor film after performing plasma etching of a source-drain electrode, and the off-current becomes increased. Disclosed is the TFT which includes: a gate electrode on an insulating substrate as a substrate; a gate insulating film on the gate electrode; an oxide semiconductor film on the gate insulating film; and a source/drain electrode on the oxide semiconductor film. It is the characteristic of the TFT that a surface layer containing at least either fluorine or chlorine exists in a part of the oxide semiconductor film where the source/drain electrode is not superimposed.

14 Claims, 8 Drawing Sheets

(56) References Cited

OTHER PUBLICATIONS

Dong-Chae Shin, Kwang-Su Park, Bo-Reum Park, HeeHwan Choe, Jae-Hong Jeon, Kang-Woong Lee, Jong Hyun Seo, A study on the dry etching characteristics of indium gallium zinc oxide and molybdenum by the CCP-RIE system for the 4 mask process, Current Applied Physics, vol. 11, Issue 5, Supplement, Sep. 2011, pp. S45-S48.*

Marrs, Michael. Mixed Oxide Thin Film Transistors for Flexible Displays. Diss. Arizona State University, 2011. Phoenix: Arizona State University, 2011.*

Jong Cheon Park, Ok Geun Jeong, Jin Kon Kim, Young-Hoon Yun, Stephen J. Pearton, Hyun Cho, Comparison of chlorine- and fluorine-based inductively coupled plasmas for dry etching of InGaZnO4 films, Thin Solid Films, vol. 546, Nov. 1, 2013, pp. 136-140.*

Nomura et al., "Room-temperature fabrication of transparent flexible thin-film transistors using amorphous oxide semiconductors" Nature, vol. 432, p. 488, (2004).

C-J Kim et al., "Characteristics and Cleaning of Dry-Etching-Damaged Layer of Amorphous Oxide Thin-Film Transistor", Electrochemical and Solid-State Letters, vol. 12, H95 (2009).

Kumomi et al., "Materials, Devices, and Circuits of Transparent Amorphous-Oxide Semiconductor", Journal of Display Technology, vol. 5, 531 (2009).

Arai et al., "Highly Reliable Oxide-Semiconductor TFT for AM-OLED Display", SID'10 Technical Digest, 69-2, (2010).

Korean Official Action—2010-45926—Jul. 12, 2013.

* cited by examiner

THIN FILM DEVICE

CROSS-REFERENCE TO RELATED APPLICATION

This application is based upon and claims the benefit of priority from Japanese patent application No. 2011-177305, filed on Aug. 12, 2011, the disclosure of which is incorporated herein in its entirety by reference.

BACKGROUND OF THE INVENTION

1. Field of the Invention

The present invention relates to a thin film device such as an oxide semiconductor thin film transistor which uses an oxide semiconductor film as an active layer. Hereinafter, the thin film transistor is referred to as "TFT", and an oxide semiconductor composed mainly of indium (In), gallium (Ga), zinc (Zn), and oxygen (O) is referred to as "IGZO (In—Ga—Zn—O)".

2. Description of the Related Art

Regarding a TFT in which the oxide semiconductor film is used for the active layer, the field-effect mobility is higher than that of a conventional amorphous silicon TFT for about one digit. Further, an increase in the off-current at the time of irradiating visible light is extremely small. Therefore, a high on-off ratio can be acquired. By using such characteristic, researches and developments of high-performance liquid crystal displays and organic EL displays using the oxide semiconductor TFT for the pixel drive element are being conducted broadly.

It is also a characteristic of the oxide semiconductor film to have a variety of compositions, so that researches and developments of various oxide semiconductor films such as an IGZO film, a Zn—O film, an In—Si—O film, and a Zn—Sn—O film are being conducted. While there are searches for various materials being conducted, those containing at least either indium (In) or zinc (Zn) are the mainstreams as the oxide semiconductor films which can provide a fine TFT characteristic.

Further, there is also a possibility that a fine thin film is created at a low temperature with the oxide semiconductor thin film compared to the case of using a silicon-based thin film. There are also the tests being conducted to achieve a flexible display by forming an oxide semiconductor TFT on a plastic substrate by utilizing the low-temperature deposited film.

Next, documents of conventional techniques will be described as the related techniques. Regarding the TFT using the oxide semiconductor thin film, Nomura, et al. first reported the TFT using an IGZO film as the semiconductor active layer (Nomura, et al., Nature, vol. 432, p. 488, (2004): Non-Patent Document 1). This document reports a method which employs plasma etching by using a fluorine-based gas as a patterning method of a source/drain metal electrode of an oxide semiconductor TFT.

C-J. Kim, et al. created an oxide semiconductor TFT using an IGZO film as an active layer through etching a source/drain electrode constituted with Ti by using mixed gas plasma of an Ar gas and an $SF_6$ gas (C-J. Kim, et al., Electrochemical and Solid-State Letters. Vol. 12, H95, (2009): Non-Patent Document 2). In this Document, it is disclosed that the off-current of the TFT is increased dramatically since an oxygen deficit layer is formed on the top face (back channel of the TFT) of the IGZO thin film at the time where the source/drain electrode constituted with Ti is etched. Further, it is also disclosed that it is necessary to perform etching to remove the oxygen deficit layer by a hydrochloric acid solution in order to decrease the increased off-current.

Further, Kumomi, et al. reports an IGZO oxide semiconductor TFT using a source/drain electrode constituted with Mo (Kumomi et al., Journal of Display Technology, vol. 5, 531 (2009): Non-Patent Document 3). In this Document, it is depicted that a granular surface layer remains on a back channel surface after etching the source/drain electrode constituted with Mo by using $CF_4$ gas plasma and that this may be a cause for the instability of the TFT characteristic. A stable characteristic is achieved by removing the surface layer through performing etching also with a hydrochloric acid solution.

T. Arai, et al. report that there is an interface layer existing in the interface between an oxide semiconductor film and a source/drain electrode (T. Arai, et al., SID' 10 Technical Digest, 69-2, (2010): Non-Patent Document 4). This Document discloses that an IGZO layer where oxygen is lost exists along with a TiOx layer in the interface between Ti as the source/drain electrode and an IGZO film as an oxide semiconductor film. However, nothing is mentioned therein regarding the surface layer of the IGZO film surface.

Etching of the source/drain electrode of the oxide semiconductor TFT is disclosed in Japanese Unexamined Patent Publication 2009-260378 (Patent Document 1). This Document discloses a manufacturing method which performs etching of an oxide semiconductor TFT channel with a gas containing fluorine or chlorine. However, nothing is mentioned therein regarding the surface layer of the etched oxide semiconductor film, and the surface layer is not controlled. Japanese Unexamined Patent Publication 2010-056542 (Patent Document 2) and Japanese Unexamined Patent Publication 2010-056539 (Patent Document 3) also disclose the structure where the interface layer exists in the interface between the oxide semiconductor film and the source/drain electrode. Those Documents disclose the structure where a buffer layer of high carrier density exists in the interface between the source/drain electrode and the IGZO film. The buffer layer is a layer formed with an IGZO film with a high oxygen deficit density and an alloy of the IGZO film and the source-drain metal, which is achieved by being deposited individually. However, nothing is mentioned therein regarding the surface layer of the IGZO film surface.

In the report (Non-Patent Document 2) of C-J. Kim, et al., plasma of an $SF_6$ gas as a fluorine-based gas is used when etching Ti that is a metal material for the source/drain electrode deposited on the upper part of the island-shaped IGZO film. Further, when performing the plasma etching, a substrate is placed on a cathode electrode side. In the oxide semiconductor TFT fabricated in this manner, the off-current is increased since an oxygen deficit layer is formed in the vicinity of the back channel as described above. Thus, it is necessary to remove the oxygen deficit layer by performing etching with hydrochloric acid. Such etching using the hydrochloric acid leads to an increase in the process cost. Also, there is an issue that the yield is dramatically decreased due to over-etching of the IGZO film since selective etching of the Ti electrode and the IGZO film is difficult. Such issues also exist in the case of Kumomi, et al., (Non-Patent Document 3).

As described, there is an issue with the oxide semiconductor TFT that the off-current becomes high since a low-resistance layer due to oxygen depletion tends to be formed on the surface of the oxide semiconductor film. Thus, how to suppress generation of the oxygen deficit layer is an issue.

Further, when the interface layer existing in the interface between the oxide semiconductor film and the source/drain electrode is individually formed as in the cases of the related techniques described above, the process cost is increased. Further, the interface layer is of low resistance, so that it is necessary to remove the interface layer in a part where the oxide semiconductor film and the source/drain electrode are not superimposed on one another by performing etching. However, the compositions of the interface layer and the oxide semiconductor film are similar. Thus, it is difficult to selectively remove only the interface layer by performing etching, so that removal by the etching becomes a cause for deteriorating the yield.

As described above, there is an issue with the oxide semiconductor TFT of the related techniques using the oxide semiconductor film that the off-current becomes high since oxygen depletion is generated in the surface region of the oxide semiconductor film after performing plasma etching of the source/drain electrode. Etching is performed for removing the oxygen deficit layer by using an acid solution such as hydrochloric acid in order to overcome such issue. However, it is a cause for deteriorating the yield and increasing the cost.

The present invention employs following structures in order to overcome such issue.

SUMMARY OF THE INVENTION

The thin film device according to an exemplary aspect of the invention is a thin film device which includes a gate electrode on a substrate, a gate insulating film on the gate electrode, an oxide semiconductor film on the gate insulating film, and a source/drain electrode on the oxide semiconductor film, wherein a surface layer containing at least either fluorine or chlorine exists in a part of the oxide semiconductor film between the source electrode and the drain electrode constituting the source/drain electrode.

The thin film device manufacturing method according to another exemplary aspect of the invention is a thin film device manufacturing method which includes: forming a gate electrode on a substrate; forming a gate insulating film on the gate electrode; forming an oxide semiconductor film on the gate insulating film; depositing a metal layer to be the source/drain electrode on the oxide semiconductor film; and selectively performing plasma etching of the metal layer by using at least either a fluorine-based gas or a chlorine-based gas thereby to form the source/drain electrode on the oxide semiconductor film and to form a surface layer containing at least either fluorine or chlorine on the oxide semiconductor film between the source electrode and the drain electrode constituting the source/drain electrode.

DETAILED DESCRIPTION OF THE PREFERRED EMBODIMENTS

Figure 1:
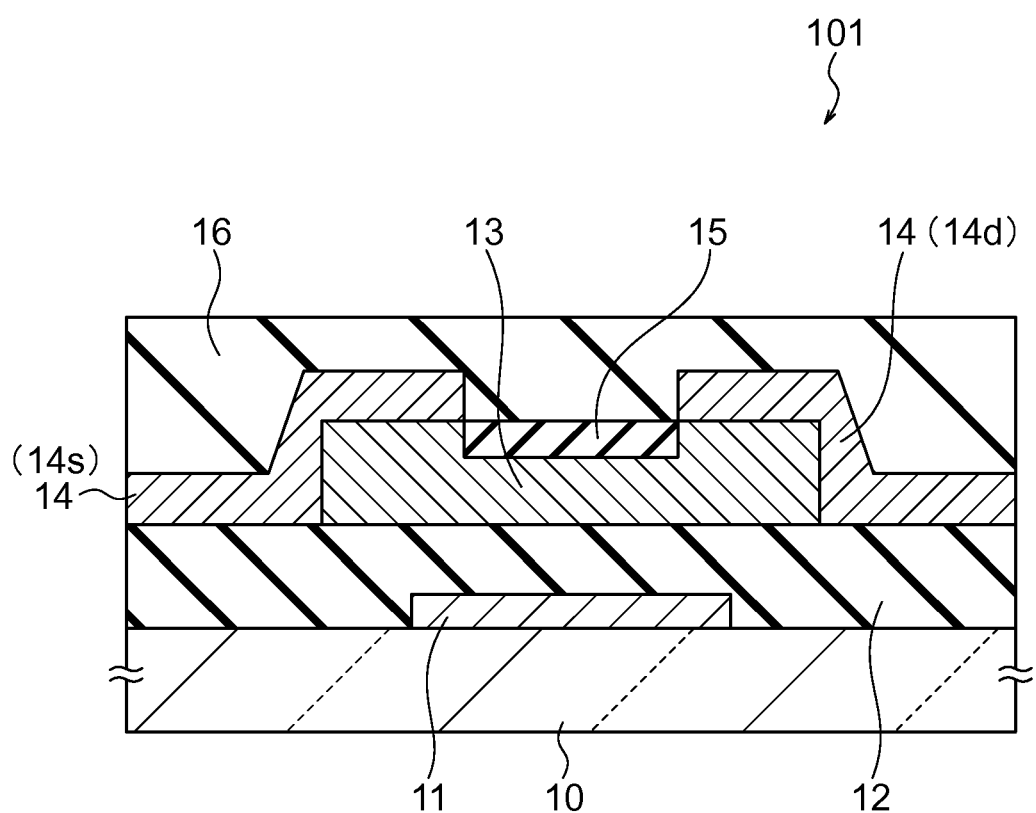
FIG. 1 is a sectional view showing the structure of an oxide semiconductor TFT according to a first exemplary embodiment.

Hereinafter, modes for carrying out the present invention (referred to as "exemplary embodiments" hereinafter) will be described by referring to the accompanying drawings. In this Specification and the drawings, same reference numerals are used for substantially the same structural elements. The shapes in the drawings are illustrated to be easily comprehended by those skilled in the art, and the dimensions and ratios thereof do not necessarily correspond to actual ones. Further, a case where "a second composition element is on a first composition element" includes: a case where "a second composition element is on a first composition element while being in contact with each other"; a case where "another composition element is on a first composition element, and a second composition element is placed thereon further"; a case where "a second composition element is on the entire part of a first composition element"; and a case where "a second composition element is only on a part of a first composition element". Further, in each of the exemplary embodiments, an oxide semiconductor TFT (referred simply to as "TFT" hereinafter) will be described as an example of the thin film device according to the present invention.

First Exemplary Embodiment

FIG. 1 is a sectional view showing a channel-etch type TFT 101 according to a first exemplary embodiment. The TFT 101 includes: a gate electrode 11 on an insulating substrate 10 as a substrate; a gate insulating film 12 on the gate electrode 11; an oxide semiconductor film 13 on the gate insulating film 12; and a source/drain electrode 14 on the oxide semiconductor film 13. The TFT 101 is characterized that a surface layer 15 containing at least either fluorine or chlorine exists in a part of the oxide semiconductor film 13 where the source/drain electrodes 14 is not superimposed (e.g., on the oxide semiconductor film 13 between a source electrode 14s and a drain electrode 14d constituting the source/drain electrode 14).

An example of the manufacturing method of the TFT 101 will be described. First, the gate electrode 11 is formed on the insulating substrate 10, the gate insulating film 12 is formed on the gate electrode 11, and the oxide semiconductor film 13 is formed on the gate insulating film 12. Then, a metal layer to be the source/drain electrode 14 is deposited on the oxide semiconductor film 13, and plasma etching is selectively performed on the metal layer by using at least either a fluorine-based gas or a chlorine-based gas. Thereby, the source/drain electrode 14 is formed on the oxide semiconductor film 13 and, at the same time, the surface layer 15 containing at least either fluorine or chlorine is formed in a part of the oxide semiconductor film 13 where the source/drain electrode 14 is not superimposed (e.g., on the oxide semiconductor film 13 between the source electrode 14s and the drain electrode 14d constituting the source/drain electrode 14). In other words, as shown in FIG. 1, the gate electrode 11 is formed on the insulating substrate 10, and the gate insulating film 12 is deposited thereon. The oxide semiconductor film 13 in an island shape is formed thereon further. The source/drain electrode 14 is formed on the island-shaped oxide semiconductor film 13. Note here that the surface layer 15 containing fluorine or chlorine exists in the vicinity of the top face of the oxide semiconductor film 13 in the part where the source/drain electrode 14 is not superimposed. This is the point of the first exemplary embodiment. Further, a passivation film 16 is deposited to cover the entire part of the TFT 101. Note here that the name "channel etch" is originated from the fact that the channel is formed by separating the source and drain by patterning the source/drain electrode 14 through performing etching.

The first exemplary embodiment will be described in more details by referring to FIG. 1.

An Al film is formed on a glass substrate as the insulating substrate 10 by a sputtering method, and the Al film is patterned into a desired shape to form the gate electrode 11. Subsequently, a silicon oxide film as the gate insulating 12 is deposited by a plasma CVD method. Then, an IGZO film as the oxide semiconductor film 13 is deposited by a sputtering method, and the IGZO film is patterned into a desired island shape. As the oxide semiconductor film 13, it is desirable to contain at least In or Zn. For example, it is possible to use any oxide semiconductor films other than the IGZO film, e.g., a ZnO film, an In—Zn—O film, an In—Si—O film, and an Al—Zn—Sn—O film.

Further, molybdenum (Mo) is deposited as a source/drain electrode metal by a sputtering method. Thereafter, Mo is etched into a desired shape by using fluorine-based gas plasma, e.g., plasma of an $SF_6$ gas or a $CF_4$ gas, to form the source/drain electrode 14. It is important that the surface layer 15 containing fluorine is formed on the surface of the IGZO film at the time of this etching. As a method of the plasma etching, it is possible to use a capacity coupler plasma source which generates plasma between parallel plate electrodes. It is desirable to perform plasma etching by placing the substrate on the electrode on the anode side (i.e., on the earth potential side) out of the parallel plate electrodes.

When etching is performed by placing the substrate on the electrode on the cathode side (i.e., the side where a large negative self-bias is generated), high-energy positive ions in the plasma accelerated by the large negative self-bias damages the etched surface. Thus, oxygen leaves from the surface of the IGZO film, so that an oxygen deficient layer is generated. For example, IGZO stoichiometry composition is $InGaZnO_4$ but a part of oxygen coupled with In, Ga, and Zn on the surface is detached, and it becomes $InGaZnO_4$-x (x is any number less than 4 herein). Such oxygen deficit layer is of low resistance, so that the off-current of the TFT is increased as it is depicted in Non-Patent Document 2.

The point of the first exemplary embodiment is the structure in which the surface layer 15 containing fluorine is formed without generating such oxygen deficit layer.

As the fluorine-based gas, it is possible to use a $CFH_3$ gas, an $NF_3$ gas, or the like other than those described above. Further, it is also possible to use a mixed gas acquired by mixing any of those gases or a mixed gas acquired by adding a rare gas such as Ar or He or an oxygen gas into those gases. It is desirable to set the gas pressure at the time of etching to be within a range of 0.5 to 50 Pa. This is because it is difficult to continuously generate plasma when the gas pressure is lower than 0.5 Pa, and it becomes hard to fluoridate the surface since the probability of the fluorine radicals in the plasma to be recoupled with gas molecules and to become extinct becomes high when the gas pressure is higher than 50 Pa.

As the source/drain electrode metal, it is also possible to use a stacked layer structure such as Ti/Al alloy/Ti. In that case, it can be patterned into the source/drain electrode 14 of a desired shape by using $Cl_2$, HCl, $BCl_3$ or the like as the gas containing chlorine. Here, it is important that chlorine is contained in the surface layer 15 of the IGZO film. As the gas used at the time of patterning, at least one selected from $Cl_2$, HCl, and $BCl_3$ simply needs to be contained. Alternatively, any mixed gases of those may be used. Further, it is also possible to use a mixed gas acquired by adding an oxide gas such as oxygen or a rare gas such as Ar or He into those gases. For example, it is possible to use a mixed gas of a $Cl_2$ gas, a $BCl_3$ gas, an oxygen gas, and a helium gas.

Further, when patterning the source/drain electrode metal by etching, both a fluorine-based gas and a chlorine-based gas may be used. For example, etching may be performed with a plasma gas constituted with a mixed gas of an $SF_6$ gas, an HCl gas, and an oxygen gas. In that case, fluorine and chlorine are both contained in the surface layer 15. Etching of the source/drain electrode metal using both the fluorine-based gas and the chlorine-based gas can be used in each of the exemplary embodiments described hereinafter.

Further, the structure of the source/drain electrode 14 is not limited only to the above-described structure. For example, it is possible to employ a stacked layer structure of alloys such as Mo alloy/Al alloy/Mo alloy or Al alloy/Mo alloy. When such Al alloy and Mo alloy are used for the source/drain electrode 14, it is desirable to perform plasma etching by using a chlorine-based gas.

At last, a silicon oxide film as the passivation film 16 is deposited by a plasma CVD method. Thereby, the TFT 101 according to the first exemplary embodiment is completed.

Figure 2:
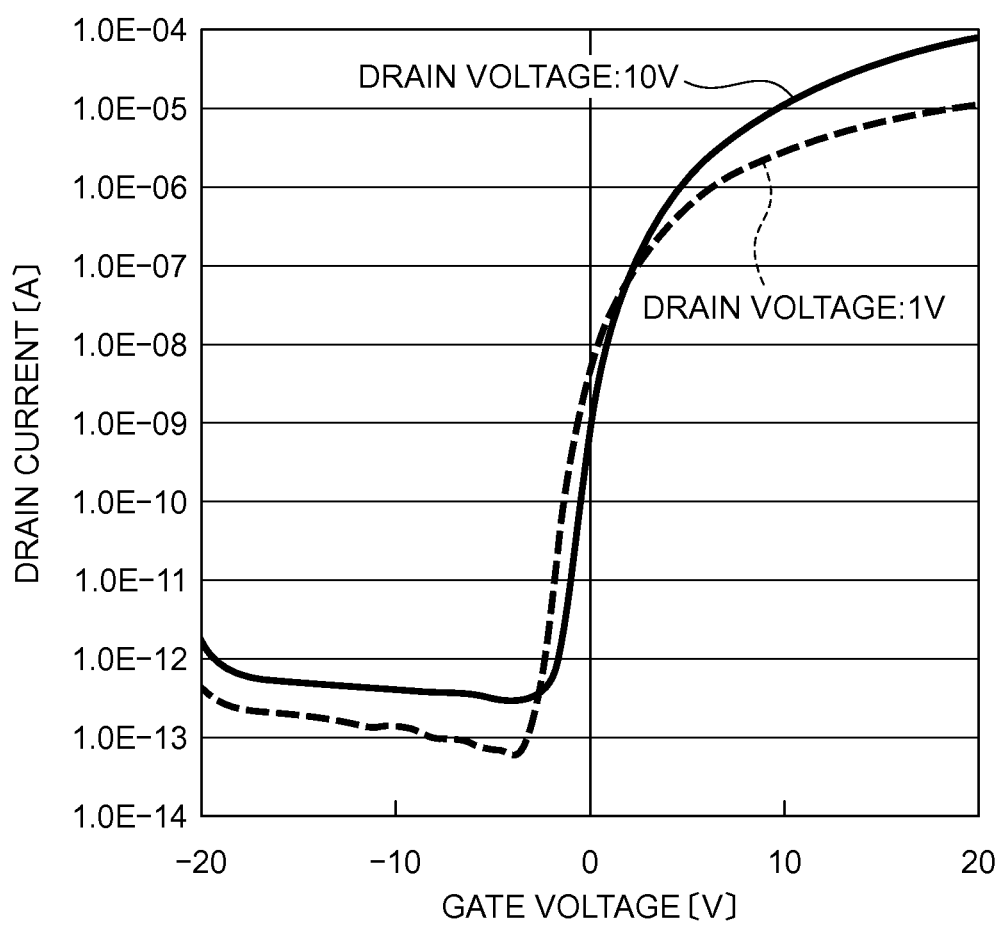
FIG. 2 is a graph showing a transmittance characteristic of the oxide semiconductor TFT according to the first exemplary embodiment.

FIG. 2 is a graph showing the transmission characteristic of the TFT 101 according to the first exemplary embodiment. In this graph, the lateral axis is the gate voltage (V), and the longitudinal axis is the drain current (A). This graph shows the characteristic of the case where the drain voltage is 1 V and the case where the drain voltage is 10V. With the TFT 101 fabricated as in the first exemplary embodiment, it is possible to achieve the characteristic, i.e., the seven-digit on-off ratio of the drain current and the field-effect mobility of $10\,cm^2V^{-1}s^{-1}$ as shown in FIG. 2, without etching the surface of the IGZO film by an acid solution unlike the case of the related techniques.

As an exemplary advantage according to the invention, the present invention is designed to include the surface layer containing at least either fluorine or chlorine on the surface of the oxide semiconductor film, so that generation of oxygen depletion can be suppressed. Therefore, it is possible to achieve the thin film device having a fine switching characteristic without etching the surface of the oxide semiconductor film.

Second Exemplary Embodiment

Figure 3:
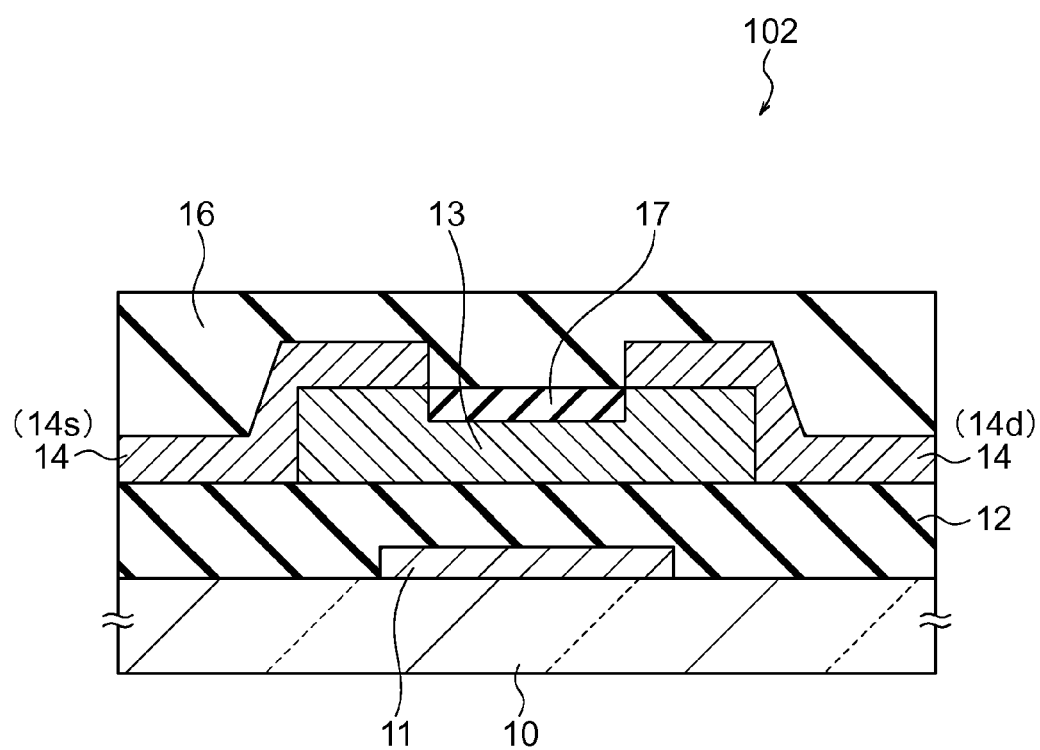
FIG. 3 is a sectional view showing the structure of an oxide semiconductor TFT according to a second exemplary embodiment.

FIG. 3 is a sectional view showing a channel-etch type TFT 102 according to a second exemplary embodiment. The TFT 102 is characterized to include a compound surface layer 17 as the surface layer containing a composition element of an oxide semiconductor film 13, a composition element of a part of a source/drain electrode 14 to be in contact with the oxide semiconductor film 13, and at least either fluorine or chlorine. Other structures of the TFT of the second exemplary embodiment are the same as the case of the TFT of the first exemplary embodiment.

An example of the manufacturing method of the TFT 102 will be described. In the second exemplary embodiment, at the time of forming the source/drain electrode 14 on the oxide semiconductor film 13, the compound surface layer 17 containing the composition element of the oxide semiconductor film 13, the composition element of the part of the source/drain electrode 14 to be in contact with the oxide semiconductor film 13, and at least either fluorine or chlorine is formed in a part of the oxide semiconductor film 13 where the source/drain electrode 14 is not superimposed (e.g., on the oxide semiconductor film 13 between a source electrode 14s and a drain electrode 14d constituting the source/drain electrode 14). Other structures of the manufacturing method of the TFT according to the second exemplary embodiment are the same as the case of the manufacturing method of the TFT according to the first exemplary embodiment.

In other words, as shown in FIG. 3, the gate electrode 11 is formed on the insulating substrate 10, and the gate insulating film 12 is formed thereon. The oxide semiconductor film 13 in an island shape is formed thereon further. The source/drain electrode 14 is formed on the island-shaped oxide semiconductor film 13. It is the point of the second exemplary embodiment that the compound surface layer 17 containing the composition element of the oxide semiconductor film 13, the composition element of the part of the source/drain electrode 14 to be in contact with the oxide semiconductor film 13, and fluorine or chlorine is formed in the vicinity of the top face of the oxide semiconductor film 13 where the source/drain electrode 14 is not superimposed. Further, the passivation film 16 is deposited to cover the entire part of the TFT 102.

The second exemplary embodiment will be described in more details by referring to FIG. 3. An Al alloy film is formed on a glass substrate as the insulating substrate 10 by a sputtering method, and the Al alloy film is patterned into a desired shape to form the gate electrode 11. Subsequently, a silicon oxide film as the gate insulating film 12 is deposited by a plasma CVD method. Then, an IGZO film as the oxide semiconductor film 13 is deposited by a sputtering method, and the IGZO film is patterned into a desired island shape. As the oxide semiconductor film 13, it is desirable to contain at least In or Zn. For example, it is possible to use any oxide semiconductor films other than the IGZO film, e.g., a ZnO film, an In—Zn—O film, an In—Si—O film, and an Al—Zn—Sn—O film.

Further, Ti and an Al alloy as the source/drain electrode metal are deposited in this order by a sputtering method. Then, after etching the Al alloy, the Ti film is etched to a desired shape by using fluorine-based gas plasma constituted with an $SF_6$ gas, for example, to form the source/drain electrode 14. Note here that it is possible to use Mo instead of Ti. In that case, Ti in the descriptions hereinafter regarding the second exemplary embodiment is replaced with Mo as appropriate.

The surface of the IGZO film is fluoridated at the time of etching, so that the compound surface layer 17 containing fluorine is formed. Further, it is important that the compound surface layer 17 containing fluorine is composed of IGZO, Ti, and F as the composition elements, and that it contains a Ti element as the source-drain metal in contact with the IGZO film. The composition of such compound surface layer 17 can be measured by SIMS (Secondary Ion-microprobe Mass Spectrometer) or the like.

Figure 4:
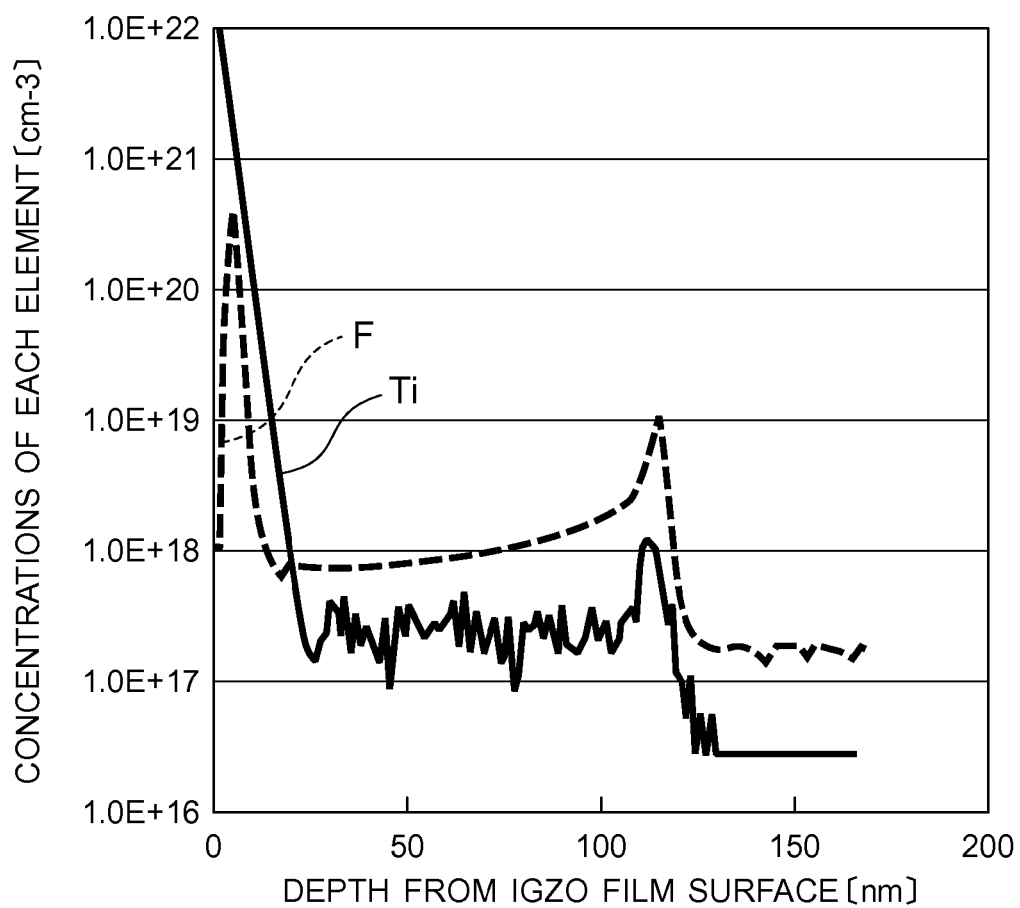
FIG. 4 is a graph showing a concentration distribution of Ti and F with respect to the depth direction from an IGZO film surface of the oxide semiconductor TFT according to the second exemplary embodiment.

For example, as shown in an SIMS profile of FIG. 4, it was confirmed that Ti and F exist in a localized manner on the surface layer of about 10 to 20 nm from the surface of the IGZO film of the second exemplary embodiment. In order to form such surface layer, it is necessary to control the plasma etching time. For example, when the etching time is too long, the Ti element becomes uncontained in the surface layer. When the etching time is too short, short-circuit is generated between the source and drains electrodes since the Ti composition is too high. Therefore, proper etching time is required.

As a method of the plasma etching, there is a method of performing etching by placing the substrate on the electrode on the anode potential side by using a capacity coupler plasma source which generates plasma between parallel plate electrodes as in the case of the first exemplary embodiment. As the fluorine-based gas, it is possible to use a $CF_4$ gas, a $CHF_3$ gas, or the like other than those described above. Further, it is also possible to use a mixed gas acquired by mixing any of those gases or a mixed gas acquired by adding a rare gas such as Ar or He or an oxygen gas into those gases. It is desirable to set the gas pressure at the time of etching to be within a range of 0.5 to 50 Pa. This is because it is difficult to continuously generate plasma when the gas pressure is lower than 0.5 Pa, and it becomes hard to fluoridate the surface since the probability of the fluorine radicals in the plasma to be recoupled with gas molecules and become extinct becomes high when the gas pressure is higher than 50 Pa.

At last, a silicon oxide film as the passivation film 16 is deposited by a plasma CVD method. Thereby, the TFT 102 according to the second exemplary embodiment is completed.

With the TFT 102 fabricated as in the second exemplary embodiment, it is possible to achieve the characteristic, i.e., the six-digit on-off ratio of the drain current and the field-effect mobility of $7\ cm^2 V^{-1} s^{-1}$, without etching the surface of the IGZO film by an acid solution unlike the case of the related techniques.

Third Exemplary Embodiment

Figure 5:
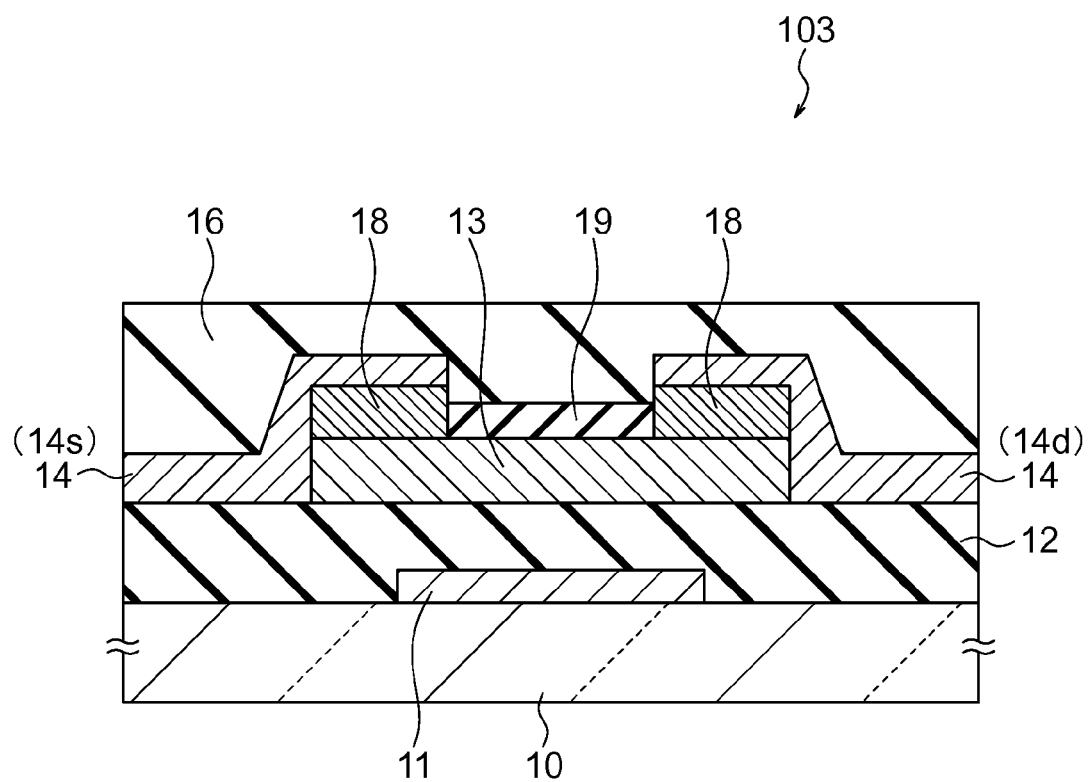
FIG. 5 is a sectional view showing the structure of an oxide semiconductor TFT according to a third exemplary embodiment.

FIG. 5 is a sectional view showing a channel-etch type TFT 103 according to a third exemplary embodiment. In the TFT 103 of the third exemplary embodiment, a mixed layer 18 containing a mixture of a composition element of an oxide semiconductor film 13 and a composition element of a part of a source/drain electrode 14 to be in contact with the oxide semiconductor film 13 exists in the interface between the oxide semiconductor film 13 and the source/drain electrode 14. Further, in the TFT 103, a multiple-element surface layer 19 constituted with the composition elements of the mixed layer 18 and at least either fluorine or chlorine exists as the surface layer. Other structures of the TFT of the third exemplary embodiment are the same as the case of the TFT of the first or second exemplary embodiment.

An example of the manufacturing method of the TFT 103 will be described. In the third exemplary embodiment, at the time of forming the source/drain electrode 14 on the oxide semiconductor film 13, the multiple-element surface layer 19 is formed on the oxide semiconductor film 13 between a source electrode 14s and a drain electrode 14d constituting the source/drain electrode 14. At the same time, the mixed layer 18 containing the mixture of the composition element of the oxide semiconductor film 13 and the composition element of the part of the source/drain electrode 14 to be in contact with the oxide semiconductor film 13 is formed on the interface between the oxide semiconductor film 13 and the source/drain electrode 14. Other structures of the manufacturing method of the TFT according to the third exemplary embodiment are the same as the case of the manufacturing method of the TFT according to the first or second exemplary embodiment.

In other words, as shown in FIG. 5, a gate electrode 11 is formed on an insulating substrate 10, and a gate insulating film 12 is formed thereon. The oxide semiconductor film 13 in an island shape is formed thereon further. The source/drain electrode 14 is formed on the island-shaped oxide semiconductor film 13. It is the point of the third exemplary embodiment that the mixed layer 18 constituted with the mixture of the composition element of the oxide semiconductor film 13 and the composition element of the part of the source/drain electrode 14 to be in contact with the oxide semiconductor film 13 exits in the interface between the oxide semiconductor film 13 and the source/drain electrodes 14 and that the multiple-element surface layer 19 constituted with the composition elements of the mixed layer 18 and fluorine or chlorine exists in the vicinity of the top face of the oxide semiconductor film 13 located between each of the two source and drain electrodes 14. Further, the passivation film 16 is deposited to cover the entire part of the TFT 103.

The third exemplary embodiment will be described in more details by referring to FIG. 5.

An Al alloy film is formed on a glass substrate as the insulating substrate 10 by a sputtering method, and the Al alloy film is patterned into a desired shape to form the gate electrode 11. Subsequently, a silicon oxide film as the gate insulating 12 is deposited by a plasma CVD method. Then, an IGZO film as the oxide semiconductor film 13 is deposited by a sputtering method, and the IGZO film is patterned into a desired island shape. As the oxide semiconductor film 13, it is desirable to contain at least In or Zn. For example, it is possible to use any oxide semiconductor films other than the IGZO film, e.g., a ZnO film, an In—Zn—O film, an In—Si—O film, and an Al—Zn—Sn—O film.

Further, Mo and an Al alloy as the source/drain electrodes metal are deposited in this order by a sputtering method. Then, the Al alloy and Mo are etched continuously into a desired shape by using chlorine-based plasma constituted with a mixed gas of $Cl_2$ and $BCl_3$, for example, to form the source/drain electrode 14. Note here that it is possible to use Ti instead of Mo. In that case, Mo in the descriptions hereinafter regarding the third exemplary embodiment is replaced with Ti as appropriate.

At the time of etching, the mixed layer 18 composed of IGZO and Mo as the composition elements is formed on the interface between the IGZO film and the Mo film. The mixed layer 18 has the smaller resistivity compared to that of the IGZO film by several digits and functions as an n+ layer, so that there is an advantage that a fine ohmic contact characteristic can be acquired. As the layer thickness of the mixed layer 18, it is desirable to be 5 to 30 nm Further, the multiple-element surface layer 19 containing chlorine is formed when the surface of the IGZO film is chlorinated. The composition elements of the multiple-element surface layer 19 are IGZO, Mo, and Cl.

In order to form such surface layer, it is necessary to control the plasma etching time. For example, when the etching time is too long, the Mo element becomes uncontained in the surface layer. When the etching time is too short, short-circuit is generated between the source and drains electrodes since the Mo composition is too high. Therefore, proper etching time is required.

As a method of the plasma etching, there is a method of performing etching by placing the substrate on the electrode on the anode potential side by using a capacity coupler plasma source which generates plasma between parallel plate electrodes as in the case of the first exemplary embodiment. As the fluorine-based gas, it is possible to use a $BCl_3$ gas, or the like other than those described above. Further, it is also possible to use a mixed gas acquired by mixing any of those gases or a mixed gas acquired by adding a rare gas such as Ar or He or an oxygen gas into those gases. It is desirable to set the gas pressure at the time of etching to be within a range of 0.5 to 50 Pa. This is because it is difficult to continuously generate plasma when the gas pressure is lower than 0.5 Pa, and it becomes hard to chlorinate the surface since the probability of the chlorine radicals in the plasma to be recoupled with gas molecules and to become extinct becomes high when the gas pressure is higher than 50 Pa.

In order to form the mixed layer 18 more efficiently, it is better to set the substrate temperature at the time of depositing the film by sputtering the source/drain electrode metal to be 120° C. or higher and to set the Ar gas pressure to be 1 Pa or less. The alloying reaction in the interface can be facilitated by increasing the substrate temperature. Further, by decreasing the gas pressure, the kinetic energy of the sputtered metal particles can be increased. Therefore, the alloying reaction on the surface can also be facilitated.

At last, a silicon oxide film as the passivation film 16 is deposited by a plasma CVD method. Thereby, the TFT 103 according to this exemplary embodiment is completed.

With the TFT 103 fabricated as in the third exemplary embodiment, it is possible to achieve the characteristic, i.e., the seven-digit on-off ratio of the drain current and the field-effect mobility of 12 $cm^2V^{-1}s^{-1}$, without etching the surface of the IGZO film by an acid solution unlike the case of the related techniques.

In the exemplary embodiment regarding the channel-etch type TFT described above, the gate insulating film and the passivation film may be formed with a stacked layer structure of a silicon nitride film and a silicon oxide film in order to suppress contamination such as Na ions from the substrate and outside. Note here that the film to be in contact with the oxide semiconductor film is desirable to be the silicon oxide film. Further, as the passivation film, it is possible to use a silicon oxide film deposited by sputtering. In order to suppress contamination, it is also possible to employ a stacked layer structure of a silicon oxide film deposited by sputtering and a silicon nitride film deposited by plasma CVD.

Fourth Exemplary Embodiment

Figure 6:
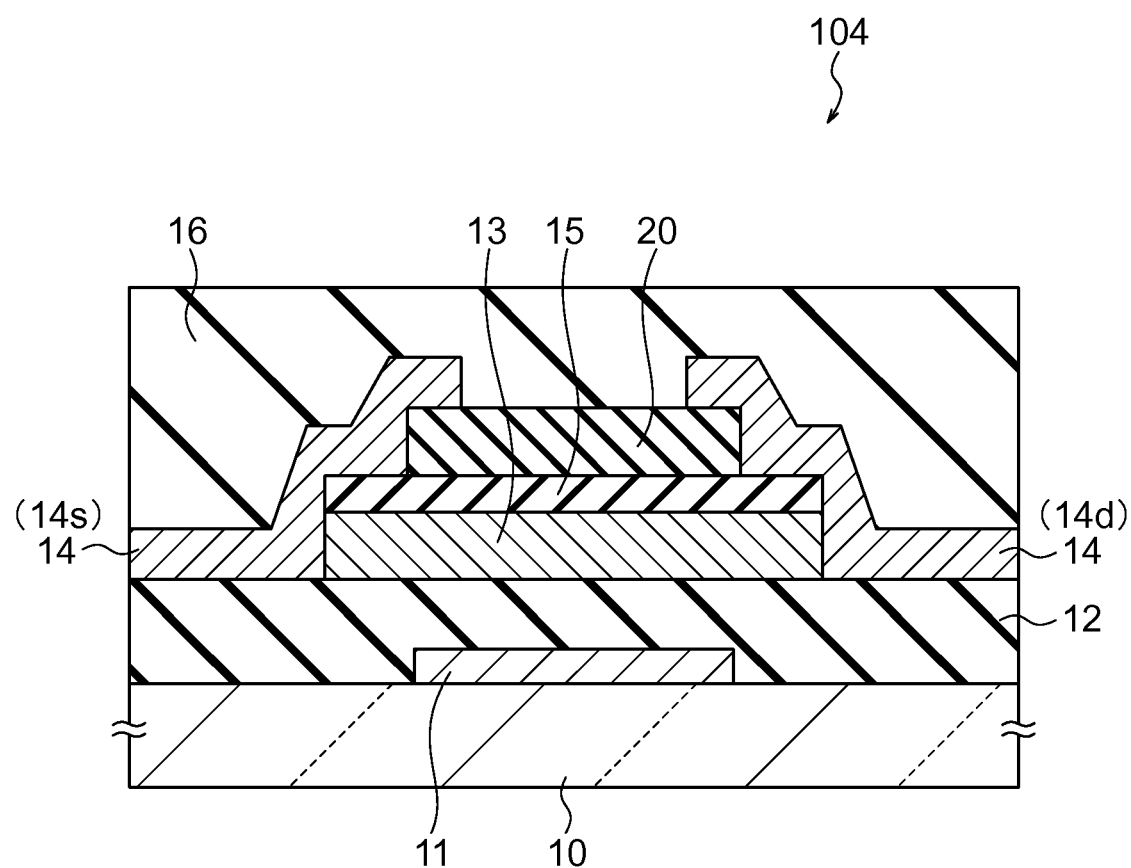
FIG. 6 is a sectional view showing the structure of an oxide semiconductor TFT according to a fourth exemplary embodiment.

FIG. 6 is a sectional view showing a channel-protection type TFT 104 according to a fourth exemplary embodiment. The TFT 104 of the fourth exemplary embodiment is characterized that a channel protection insulating film 20 is provided further on a surface layer 15, and that the surface layer 15 also exists in a part of an oxide semiconductor film 13 where a source/drain electrodes 14 is superimposed. In the fourth exemplary embodiment, the entire top face of the oxide semiconductor film 13 is the surface layer 15. Other structures of the TFT 104 of the fourth exemplary embodiment are the same as the case of the TFT of the first or second exemplary embodiment.

An example of the manufacturing method of the TFT 104 will be described. First, a gate electrode 11 is formed on an insulating substrate 10 as the substrate, a gate insulating film 12 is formed on the gate electrode 11, and the oxide semiconductor film 13 is formed on the gate insulating film 12. Then, the surface layer 15 containing at least either fluorine or chlorine is formed on the entire surface of the oxide semiconductor film 13 by performing plasma processing using either a fluorine-based gas or a chlorine-based gas on the surface of the oxide semiconductor film 13. Further, the channel protection insulating film 20 is formed on a part of the surface layer 15, and the source/drain electrode 14 is formed on the surface layer 15 and the channel protection insulating film 20.

In other words, as shown in FIG. 6, the gate electrode 11 is formed on the insulating substrate 10, and the gate insulating film 12 is formed thereon. The oxide semiconductor film 13 in an island shape and the channel protection insulating film 20 are formed thereon further. The source/drain electrode 14 is formed on the island-shaped oxide semiconductor film 13 and the channel protection insulating film 20. It is the point of the fourth exemplary embodiment that the surface layer 15 containing fluorine or chlorine is formed in the vicinity of the top face of the entire part (both the part that does not overlap with the source/drain electrodes 14 and the part that overlaps with the source/drain electrodes 14) of the oxide semiconductor film 13. Further, a passivation film 16 is deposited to cover the entire part of the TFT 104. Note here that "channel protection" is originated from the fact that the channel is formed by separating the source and the drain with the channel protection insulating film 20 that is formed on the oxide semiconductor film 13, unlike the case of "channel etch" described above.

The fourth exemplary embodiment will be described in more details by referring to FIG. 6.

A Cr film is deposited on a glass substrate as the insulating substrate 10 by a sputtering method, and the Cr film is patterned into a desired shape to form the gate electrode 11. Subsequently, a silicon oxide film as the gate insulating film 12 is deposited by a plasma CVD method. Then, an IGZO film as the oxide semiconductor film 13 is deposited by a sputtering method, and the IGZO film is patterned into a desired island shape.

Thereafter, plasma processing is performed by exposing the island-shaped IGZO film in a fluorine-based plasma gas or a chlorine-based plasma gas. It is important that the surface of the IGZO film is fluoridated or chlorinated at the time of the plasma processing so that the surface layer 15 containing fluorine or chlorine is formed.

As a method of the plasma processing, it is possible to use a capacity coupler plasma source which generates plasma between parallel plate electrodes. It is desirable to perform plasma processing by placing the substrate on the electrode on the anode side (i.e., on the earth potential side) out of the parallel plate electrodes.

When etching is performed by placing the substrate on the electrode on the cathode side (i.e., the side where a large negative self-bias is generated), high-energy positive ions in the plasma accelerated by the large negative self-bias damages the etching surface. Thus, oxygen leaves from the surface of the IGZO film, so that an oxygen deficient layer is generated. Such oxygen deficit layer is of low resistance, so that the off-current of the TFT is increased as it is depicted in Non-Patent Document 2. The point of the fourth exemplary embodiment is the structure in which the surface layer containing fluorine or chlorine is formed without generating such oxygen deficit layer.

As the fluorine-based gas, it is possible to use an $SF_6$ gas, a $CF_4$ gas, and a mixed gas of those with other gases. Further, as the chlorine-based gas, it is also possible to use a mixed gas acquired by mixing a $Cl_2$ gas, an HCl gas, a $BCl_3$ gas, and a mixed gas of those with other gases. A mixed gas of a fluorine-based gas and a chlorine-based gas may also be used. In that case, a surface layer containing both fluorine and chlorine is formed.

It is desirable to set the gas pressure at the time of plasma processing to be within a range of 0.5 to 50 Pa. This is because it is difficult to continuously generate plasma when the gas pressure is lower than 0.5 Pa, and it becomes hard to fluoridate or chlorinate the surface since the probability of the fluorine radicals or chlorine radicals in the plasma to be recoupled with gas molecules and to become extinct becomes high when the gas pressure is higher than 50 Pa. Further, as the oxide semiconductor film 13, it is desirable to contain at least In or Zn. For example, it is possible to use any oxide semiconductor films other than the IGZO film, e.g., a ZnO film, an In—Zn—O film, an In—Si—O film, and an Al—Zn—Sn—O film.

In the above, after patterning the IGZO film into an island-shape, the IGZO film is exposed to the fluorine-based plasma gas or the chlorine-based plasma gas to form the surface layer containing fluorine or chlorine. However, it is also possible to reverse the execution order thereof. That is, after depositing the IGZO film, the IGZO film may be exposed to the fluorine-based plasma gas or the chlorine-based plasma gas to form the surface layer containing fluorine or chlorine. Thereafter, the IGZO film may be patterned into a desired island shape. Subsequently, molybdenum (Mo) as the source/drain electrode metal is deposited by a sputtering method. Then, Mo is etched into a desired shape by using fluorine-based plasma such as plasma of an $SF_6$ gas or a $CF_4$ gas to form the source/drain electrode 14. Note here that it is possible to use titanium (Ti) as the source/drain electrode metal.

At last, a silicon oxide film as the passivation film 16 is deposited by a plasma CVD method. Thereby, the TFT 104 according to the fourth exemplary embodiment is completed.

With the TFT 104 fabricated as in the fourth exemplary embodiment, it is possible to achieve the characteristic, i.e., the seven-digit on-off ratio of the drain current and the field-effect mobility of 15 $cm^2V^{-1}$ $s^{-1}$, without etching the surface of the IGZO film by an acid solution unlike the case of the related techniques.

Fifth Exemplary Embodiment

Figure 7:
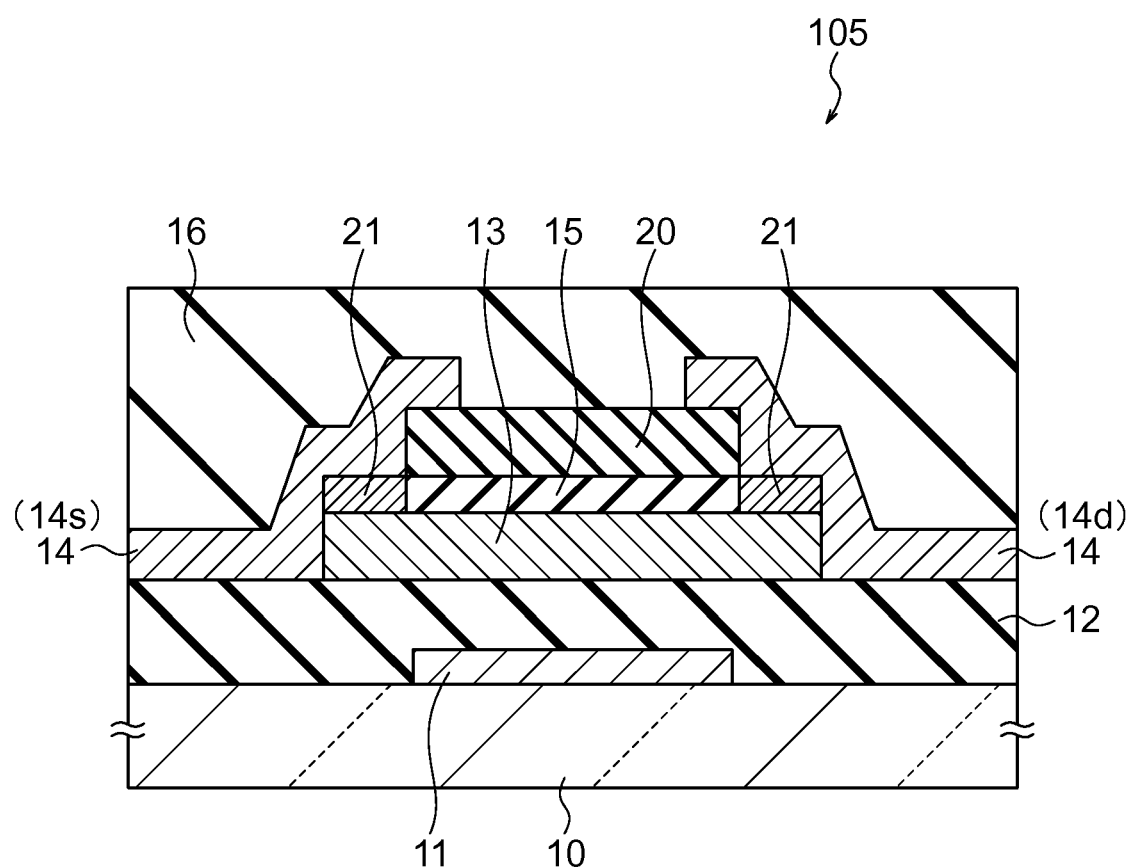
FIG. 7 is a sectional view showing the structure of an oxide semiconductor TFT according to a fifth exemplary embodiment.

FIG. 7 is a sectional view showing a TFT 105 according to a fifth exemplary embodiment. The TFT 105 of the fifth exemplary embodiment is characterized that a channel protection insulating film 20 is provided further on a surface layer 15. Further, The TFT 105 is characterized to include, in the interface between an oxide semiconductor film 13 and a source/drain electrode 14, a compound mixed layer 21 constituted with a mixture of a composition element of the oxide semiconductor film 13, a composition element of a part of the source/drain electrode 14 to be in contact with the oxide semiconductor film 13, and at least either fluorine or chlorine. Other structures of the TFT 105 of the fifth exemplary embodiment are the same as those of the TFT of the fourth exemplary embodiment.

An example of the manufacturing method of the TFT 105 will be described. In the fifth exemplary embodiment, a metal layer to be the source/drain electrode 14 is deposited on a part of the surface layer 15 that is not covered by the channel protection insulating film 20 and on the channel protection insulating film 20 at the time of forming the source/drain electrode 14 on the surface layer 15 and the channel protection insulating film 20, and plasma etching is selectively performed on the metal layer. Thereby, the surface layer 15 between the oxide semiconductor film 13 and the source/drain electrode 14 is replaced with the compound mixed layer 21 as the mixed layer containing the mixture of the composition elements (the composition element of the oxide semiconductor film 13 and at least either fluorine or chlorine) of the surface layer 15 and the composition element of the part of the source/drain electrode 14 in contact with the surface layer 15. Other structures of the manufacturing method of the TFT 105 according to the fifth exemplary embodiment are the same as those of the manufacturing method of the TFT according to the fourth exemplary embodiment.

In other words, as shown in FIG. 7, a gate electrode 11 is formed on an insulating substrate 10, and a gate insulating film 12 is formed thereon. The oxide semiconductor film 13 in an island shape and the channel protection insulating film 20 are formed thereon further. The source/drain electrode 14 is formed on the island-shaped oxide semiconductor film 13 and the channel protection insulating film 20. It is the point of the fifth exemplary embodiment that the compound mixed layer 21 constituted with the mixture of the composition element of the island-shaped oxide semiconductor film 13, the composition element of the source/drain electrode 14 in contact with the oxide semiconductor film 13, and fluorine or chlorine exists in the interface between the island-shaped oxide semiconductor film 13 and the source/drain electrode 14 and that the surface layer 15 containing the composition element of the oxide semiconductor film 13 and fluorine or chlorine exists in the vicinity of the top face of the entire part (both the part that does not overlap with the source/drain electrode 14 and the part that overlaps with the source/drain electrode 14) of the oxide semiconductor film 13. Further, a passivation film 16 is deposited to cover the entire part of the TFT 105.

The fifth exemplary embodiment will be described in more details by referring to FIG. 7.

A Cr film is deposited on a glass substrate as the insulating substrate 10 by a sputtering method, and the Cr film is patterned into a desired shape to form the gate electrode 11. Subsequently, a silicon oxide film as the gate insulating film 12 is deposited by a plasma CVD method. Then, an IGZO film as the oxide semiconductor film 13 is deposited by a sputtering method, and the IGZO film is patterned into a desired island shape.

Thereafter, plasma processing is performed by exposing the island-shaped IGZO film in a fluorine-based plasma gas or a chlorine-based plasma gas. The entire surface of the IGZO film is fluoridated or chlorinated at the time of the plasma processing, so that the surface layer 15 containing fluorine or chlorine is formed.

As the oxide semiconductor film 13, it is desirable to contain at least In or Zn. For example, it is possible to use any oxide semiconductor films other than the IGZO film, e.g., a ZnO film, an In—Zn—O film, an In—Si—O film, and an Al—Zn—Sn—O film.

Thereafter, a silicon oxide film as the channel protection insulating film 20 is deposited by a plasma CVD method, and the silicon oxide film is patterned into a desired shape. Further, Ti and an Al alloy as the source/drain electrode metal are deposited in this order by a sputtering method. Then, only the Al alloy is removed first by etching. Thereafter, Ti is etched into a desired shape by using fluorine-based plasma such as plasma of an $SF_6$ gas or a $CF_4$ gas to form the source/drain electrode 14. Note here that it is possible to use Mo instead of Ti. In that case, Ti in the descriptions hereinafter regarding the fifth exemplary embodiment is replaced with Mo as appropriate.

At the time of etching, the compound mixed layer 21 composed of IGZO, Ti, and F or Cl is formed in the interface between the IGZO-F film and the Ti film. The compound mixed layer 21 has the smaller resistivity compared to that of the IGZO-F(Cl) film by several digits and functions as an n+ layer, so that there is an advantage that a fine ohmic contact characteristic can be acquired when the compound mixed layer 21 is formed. Particularly, the IGZO-F(Cl) film tends to be a high-resistance film. Therefore, it is important to form the low-resistance compound mixed layer 21 by also alloying Ti to the IGZO-F(Cl) film in order to achieve a fine ohmic contact characteristic.

Further, as the layer thickness of the compound mixed layer 21, it is desirable to be 5 to 30 nm. Furthermore, in order to form the compound mixed layer 21 more efficiently, it is better to set the substrate temperature at the time of depositing the film by sputtering the source/drain electrode metal to be 120° C. or higher and to set the Ar gas pressure to be 1 Pa or less. The alloying reaction in the interface can be facilitated by increasing the substrate temperature. Further, by decreasing the gas pressure, the kinetic energy of the sputtered metal particles can be increased. Therefore, the alloying reaction on the surface can also be facilitated.

At last, a silicon oxide film as the passivation film 16 is deposited by a plasma CVD method. Thereby, the TFT 105 according to the fifth exemplary embodiment is completed.

With the TFT 105 fabricated as in the fifth exemplary embodiment, it is possible to achieve the characteristic, i.e., the seven-digit on-off ratio of the drain current and the field-effect mobility of 15 $cm^2V^{-1}s^{-1}$, without etching the surface of the IGZO film by an acid solution unlike the case of the related techniques.

In the exemplary embodiment regarding the channel-protection type TFT described above, the gate insulating film and the passivation film may be formed with a stacked layer structure of a silicon nitride film and a silicon oxide film in order to suppress contamination such as Na ions from the substrate and outside. Note here that the film to be in contact with the oxide semiconductor film is desirable to be the silicon oxide film. The channel protection film may be a silicon oxide film deposited by sputtering.

Sixth Exemplary Embodiment

Figure 8:
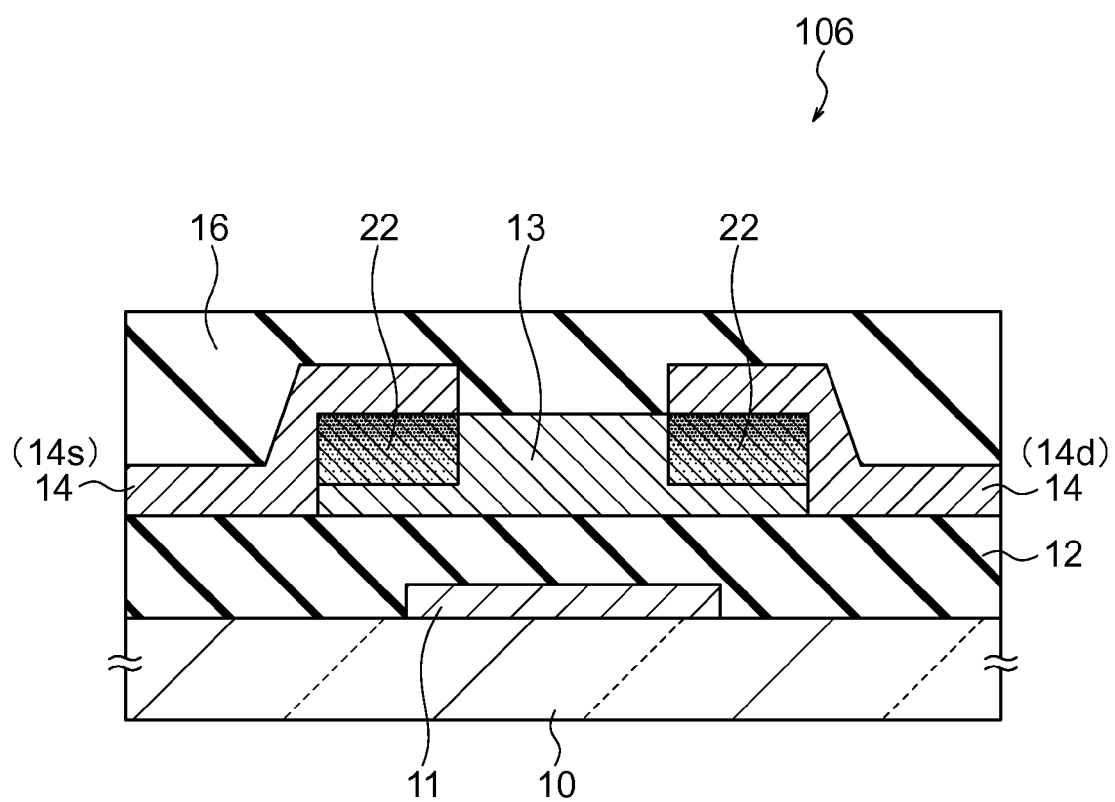
FIG. 8 is a sectional view showing the structure of an oxide semiconductor TFT according to a sixth exemplary embodiment.

FIG. 8 is a sectional view showing a TFT 106 according to a sixth exemplary embodiment. The TFT 106 includes: a gate electrode 11 on an insulating substrate 10 as a substrate; a gate insulating film 12 on the gate electrode 11; an oxide semiconductor film 13 on the gate insulating film 12; and source/drain electrode 14 on the oxide semiconductor film 13. Further, the TFT 106 is characterized to include, in the interface between the oxide semiconductor film 13 and the source/drain electrode 14, a concentration gradient mixed layer 22 in which the number of atoms of the composition element changes from the source/drain electrode 14 side towards the oxide semiconductor film 13 side. Other structures of the TFT 106 according to the sixth exemplary embodiment are the same as those of the TFT of the first exemplary embodiment except for the surface layer.

An example of the manufacturing method of the TFT 106 of the sixth exemplary embodiment will be described. As the manufacturing method of the TFT 106 according to the sixth exemplary embodiment, the gate electrode 11 is formed on the insulating substrate 10 as the substrate, the gate insulating film 12 is formed on the gate electrode 11, the oxide semiconductor film 13 is formed on the gate insulating film 12, the source/drain electrode 14 is formed on the oxide semiconductor film 13 and, at the same time, the concentration gradient mixed layer 22 containing the composition element of the oxide semiconductor film 13 and the composition element of a part of the source/drain electrodes 14 in contact with the oxide semiconductor film 13 is formed in the interface between the oxide semiconductor film 13 and the source/drain electrode 14. In the sixth exemplary embodiment, when forming the concentration gradient mixed layer 22, it is formed in such a manner that the number of atoms of the composition element changes from the source/drain electrode 14 side towards the oxide semiconductor film 13 side. Other structures of the manufacturing method of the TFT 106 according to the sixth exemplary embodiment are the same as those of the manufacturing method of the TFT of the first exemplary embodiment except for the surface layer.

In other words, as shown in FIG. 8, the gate electrode 11 is formed on the insulating substrate 10, and the gate insulating film 12 is deposited thereon. The oxide semiconductor film 13 in an island shape is formed thereon further. The source/drain electrode 14 is formed on the island-shaped oxide semiconductor film 13. It is the point of the sixth exemplary embodiment that the concentration gradient mixed layer 22 constituted with the mixture of the composition element of the oxide semiconductor film 13 and the composition element of the source/drain electrode 14 in contact with the oxide semiconductor film 13 exists in the interface between the oxide semiconductor film 13 and the source/drain electrode 14 and that the number of atoms of the composition element of the concentration gradient mixed layer 22 changes from the source/drain electrode 14 side towards the oxide semiconductor film 13 side. Further, a passivation film 16 is deposited to cover the entire part of the TFT 106. While the structure shown in FIG. 8 does not include the surface layer shown in FIG. 1 with reference numeral 15, shown in FIG. 3 with reference numeral 17, and shown in FIG. 5 with reference numeral 19, such surface layer may also be provided to the structure shown in FIG. 8.

The sixth exemplary embodiment will be described in more details by referring to FIG. 8.

An Mo film is deposited on a glass substrate as the insulating substrate 10 by a sputtering method, and the Mo film is patterned into a desired shape to form the gate electrode 11. Subsequently, a silicon oxide film as the gate insulating film 12 is deposited by a plasma CVD method. Then, an IGZO film as the oxide semiconductor film 13 is deposited by a sputtering method, and the IGZO film is patterned into a desired island shape.

As the oxide semiconductor film 13, it is desirable to contain at least In or Zn. For example, it is possible to use any oxide semiconductor films other than the IGZO film, e.g., a ZnO film, an In—Zn—O film, an In—Si—O film, and an Al—Zn—Sn—O film.

Further, Ti and an Al alloy as the source/drain electrode metal are deposited in this order by a sputtering method. Then, those metal films are etched into a desired shape to form the source/drain electrode 14. Note here that it is possible to use Mo instead of Ti. In that case, Ti in the descriptions hereinafter regarding the sixth exemplary embodiment is replaced with Mo as appropriate.

Before depositing the source-drain metal films, it is desirable to expose the surface of the IGZO film to a rare gas puttering plasma of Ar or He, for example. Specifically, it is possible to employ a method which discharges electricity in the rare gas plasma by having the substrate side as the cathode potential (the so-called reverse sputtering discharge) before depositing the source-drain metal Ti film by sputtering, for example.

Thereafter, when the Ti metal is deposited, the concentration gradient mixed layer 22 composed of IGZO and Ti in which the concentration gradient regarding the ratio of the numbers of atoms of the composition elements changes from the source/drain electrode 14 side towards the oxide semiconductor film 13 side is formed in the interface between the IGZO film and the Ti film. Specifically, the number of atoms of Ti decreases from the Ti electrode side towards the IGZO film side, and the number of atoms of In increases from the Ti electrode side towards the IGZO film side. In the mixed layer having such concentration gradient, the resistivity is lowered gradually from the IGZO film side towards the Ti electrode side, so that the ohmic contact characteristic can be acquired easily.

As the thickness of the concentration gradient mixed layer 22, it is desirable to be 5 to 30 nm. Patent Document 3 discloses a method which individually deposits the mixed layer. However, when the mixed layer is deposited individually, the composition thereof becomes uniform, so that it is not possible to form the mixed layer having the concentration gradient as in the case of the sixth exemplary embodiment. The mixed layer having such concentration gradient can be formed not only with the IGZO film but also with any oxide semiconductor films such as a ZnO film, an In—Zn—O film, an In—Si—O film, and an Al—Zn—Sn—O film.

The mixed layer having such concentration gradient can be employed for the TFTs in any of the structures (i.e., the channel-etch type or channel protection type) shown in FIGS. 1, 3, 5, 6, and 7 described in the first to fifth exemplary embodiments.

SUMMARY

In each of the above-described exemplary embodiments, the cases of using Ti, Mo, a Ti alloy, and an Mo alloy as the source-drain metal in the part to be in contact with the oxide semiconductor are mainly described. However, materials for the source-drain metal are not limited only to those. Specifically, a Cu alloy, an Al alloy, Cr, W, or the like may be in contact with the oxide semiconductor film. Further, on those metal materials, a plurality of any other metal materials may also be stacked.

The layer thickness of the surface layer containing fluorine or chlorine on the surface of the oxide semiconductor film is desirable to be between 3 nm and 20 nm, inclusive. When the layer thickness of less than 3 nm, there is a possibility that sufficient fluoridation cannot be done and an oxygen deficit region is remained within the surface layer. Meanwhile, when the layer thickness exceeds 20 nm, the layer of the oxide semiconductor film functioning as the active layer becomes too thin so that the transistor characteristic is deteriorated. The film thickness of the typical oxide semiconductor film of the TFT is within a range of about 30 nm to 100 nm. The layer thickness of such surface layer containing fluorine or chlorine can be controlled by changing the plasma discharge power and discharge time at the time of plasma etching conducted by using a fluorine-based or chlorine-based gas.

The proportion of the number of atoms of fluorine or chlorine of the surface layer containing fluorine or chlorine on the surface of the oxide semiconductor film is desirable to be between 0.1% and 73%, inclusive. In the case where the proportion is less than 0.1%, fluoridation or chlorination becomes insufficient. Thus, an oxygen deficit region is remained within the surface layer, thereby increasing the off-current of the TFT. Meanwhile, in the case where the oxide semiconductor film is an IGZO film, the composition proportion of fluorine or chlorine in the stoichiometric composition becomes 73% when the oxygen on the surface layer is all replaced with fluorine or chlorine. When the proportion of fluorine or chlorine becomes more than that, a fault is generated. Further, in the cases of the other oxide semiconductor films of ZnO and the like, the proportion of fluorine becomes 73% or less even when oxygen is replaced entirely with fluorine or chlorine.

In other words, in order to overcome the issues described above, the present invention provides the channel-etch bottom gate type TFT in which the gate electrode, the gate insulating film, the oxide semiconductor film, and the source/drain electrode are formed on the substrate in this order, and the TFT includes the surface layer containing fluorine or chlorine in the vicinity of the top face (the surface on the opposite side of the side in contact with the gate insulating film) of the oxide semiconductor film that does not overlap with the source/drain electrode.

Further, the present invention provides such TFT in which the surface layer containing fluorine or chlorine is constituted with the composition element of the oxide semiconductor film, the composition element of the source/drain electrodes in a part to be in contact with the oxide semiconductor film, and fluorine or chlorine. Furthermore, the present invention provides the TFT which includes the surface layer containing fluorine or chlorine constituted with the composition element of the oxide semiconductor film, the composition element of the source/drain electrode in a part to be in contact with the oxide semiconductor film, and fluorine or chlorine, in which the mixed layer constituted with the mixture of the composition element of the oxide semiconductor film and the composition element of the source/drain electrode exits in the interface between the oxide semiconductor film and the source/drain electrode.

Moreover, the present invention provides the channel protection bottom gate type TFT in which the gate electrode, the gate insulating film, the oxide semiconductor film, the channel protection insulating film, and the source/drain electrode are formed on the substrate in this order, and the TFT includes the surface layer containing fluorine or chlorine in the vicinity of the top face (the surface on the opposite side of the side in contact with the gate insulating film) of the entire oxide semiconductor film.

Further, the present invention provides such TFT in which the surface layer containing fluorine or chlorine is constituted with the composition element of the oxide semiconductor film and fluorine or chlorine. Furthermore, the present invention provides the TFT in which the mixed layer constituted with the mixture of the composition element of the oxide semiconductor film, the composition element of the source/drain electrode, and fluorine or chlorine exits in the interface between the oxide semiconductor film and the source/drain electrode.

In such TFTs, as the oxide semiconductor film, it is desirable to use an oxide semiconductor film containing at least indium or zinc. The surface layer containing fluorine or chlorine can be achieved by etching the source/drain electrode by using fluorine-based gas plasma or chlorine-based gas plasma. At the time of etching, it is desirable to set the substrate on the earth electrode side of the plasma device.

Through employing the present invention, it is possible to achieve low-cost and high-performance TFTs. The present invention makes it possible to achieve the TFT having a fine switching characteristic without etching the surface of the oxide semiconductor film, since generation of oxygen deficit can be suppressed through forming the surface layer containing fluorine or chlorine on the surface of the oxide semiconductor film.

While the present invention has been described by referring to the specific exemplary embodiments shown in the accompanying drawings, the present invention is not limited only to each of the exemplary embodiments shown in the drawings. Any changes and modifications occurred to those skilled in the art can be applied to the structures and the details of the present invention. Further, it is to be noted that the present invention includes combinations of a part of or the entire part of each of the exemplary embodiments combined mutually in an appropriate manner.

While a part of or the entire part of the exemplary embodiments can be summarized as in following Supplementary Notes, the present invention is not necessarily limited to those structures.

Supplementary Note 1

First Exemplary Embodiment, FIG. 1

A thin film device which includes a gate electrode on a substrate, a gate insulating film on the gate electrode, an oxide semiconductor film on the gate insulating film, and a source/drain electrode on the oxide semiconductor film, wherein a surface layer containing at least either fluorine or chlorine exists in a part of the oxide semiconductor film where the source/drain electrode is not superimposed (e.g., the oxide semiconductor film between the source electrode and the drain electrode constituting the source/drain electrode).

Supplementary Note 2

Second Exemplary Embodiment, FIG. 3

The thin film device as depicted in Supplementary Note 1, wherein the surface layer contains a composition element of the oxide semiconductor film, a composition element of a part of the source/drain electrode in contact with the oxide semiconductor film, and at least either fluorine or chlorine.

Supplementary Note 3

Third Exemplary Embodiment, FIG. 5

The thin film device as depicted in Supplementary Note 1 or 2, wherein a mixed layer containing a mixture of the composition element of the oxide semiconductor film and the composition element of the part of the source/drain electrode in contact with the oxide semiconductor film exists in an interface between the oxide semiconductor film and the source/drain electrode.

Supplementary Note 4

Fourth Exemplary Embodiment, FIG. 6

The thin film device as depicted in Supplementary Note 1 or 2, which further includes a channel protection insulating film on the surface layer, wherein the surface layer also exists in a part of the oxide semiconductor film where the source/drain electrode is superimposed.

Supplementary Note 5

Fifth Exemplary Embodiment, FIG. 7

The thin film device as depicted in Supplementary Note 4, wherein a mixed layer containing a mixture of the composition element of the oxide semiconductor film, the composition element of the part of the source/drain electrode in contact with the oxide semiconductor film, and at least either fluorine or chlorine exists in the interface between the oxide semiconductor film and the source/drain electrode.

Supplementary Note 6

Sixth Exemplary Embodiment, FIG. 8

A thin film device which includes a gate electrode on a substrate, a gate insulating film on the gate electrode, an oxide semiconductor film on the gate insulating film, and a source/drain electrode on the oxide semiconductor film, wherein: a mixed layer containing a mixture of the composition element of the oxide semiconductor film and the composition element of a part of the source/drain electrode in contact with the oxide semiconductor film exists in an interface between the oxide semiconductor film and the source/drain electrode; and the number of atoms of composition elements of the mixed layer changes from the source/drain electrode side towards the oxide semiconductor film side.

Supplementary Note 7

The thin film device as depicted in any one of Supplementary Notes 1 to 6, wherein the oxide semiconductor film contains at least either indium or zinc.

Supplementary Note 8

The thin film device as depicted in any one of Supplementary Notes 1 to 7, wherein the proportion of the number of atoms of fluorine or the number of atoms of chlorine of the surface layer is between 0.1% and 73%, inclusive.

Supplementary Note 9

The thin film device as depicted in any one of Supplementary Notes 1 to 8, wherein the part of the source/drain electrode in contact with the oxide semiconductor film contains at least titanium or molybdenum.

Supplementary Note 10

The thin film device as depicted in Supplementary Note 3 or 6, wherein: the surface layer contains indium, gallium, zinc, oxygen, titanium, and at least either fluorine or chlorine; and the mixed layer contains indium, gallium, zinc, oxygen, and titanium.

Supplementary Note 10A

The thin film device as depicted in Supplementary Note 5, wherein: the surface layer contains indium, gallium, zinc, oxygen, and at least either fluorine or chlorine; and the mixed layer contains indium, gallium, zinc, oxygen, titanium, and at least either fluorine or chlorine.

Supplementary Note 11

The thin film device as depicted in Supplementary Note 3 or 6, wherein: the surface layer contains indium, gallium, zinc, oxygen, molybdenum, and at least either fluorine or chlorine; and the mixed layer contains indium, gallium, zinc, oxygen, and molybdenum.

Supplementary Note 11A

The thin film device as depicted in Supplementary Note 5, wherein: the surface layer contains indium, gallium, zinc, oxygen, and at least either fluorine or chlorine; and the mixed layer contains indium, gallium, zinc, oxygen, molybdenum, and at least either fluorine or chlorine.

Supplementary Note 12

The thin film device as depicted in Supplementary Note 6, wherein: the mixed layer contains indium, gallium, zinc, oxygen, and titanium; and the number of atoms of titanium of the mixed layer decreases from the source/drain electrode side towards the oxide semiconductor film side, and the number of atoms of indium or zinc of the mixed layer increases from the source/drain electrode side towards the oxide semiconductor film side.

Supplementary Note 13

The thin film device as depicted in Supplementary Note 6, wherein: the mixed layer contains indium, gallium, zinc, oxygen, and molybdenum; and the number of atoms of molybdenum of the mixed layer decreases from the source/drain electrode side towards the oxide semiconductor film side, and the number of atoms of indium or zinc of the mixed layer increases from the source/drain electrode side towards the oxide semiconductor film side.

Supplementary Note 14

First Exemplary Embodiment, FIG. 1

A thin film device manufacturing method which includes: forming a gate electrode on a substrate; forming a gate insulating film on the gate electrode; forming an oxide semiconductor film on the gate insulating film; depositing a metal layer to be the source/drain electrode on the oxide semiconductor film; and selectively performing plasma etching of the metal layer by using at least either a fluorine-based gas or a chlorine-based gas thereby to form the source/drain electrode on the oxide semiconductor film and to form a surface layer containing at least either fluorine or chlorine in a part of the oxide semiconductor film where the source/drain electrode is not superimposed (e.g., the oxide semiconductor film between the source electrode and the drain electrode constituting the source/drain electrode).

Supplementary Note 15

Second Exemplary Embodiment, FIG. 3

The thin film device manufacturing method as depicted in Supplementary Note 14, which, when forming the source/drain electrode on the oxide semiconductor film, deposits the metal layer to be the source/drain electrode on the oxide semiconductor film, and selectively performs plasma etching of the metal layer by using at least either a fluorine-based gas or a chlorine-based gas thereby to form a surface layer containing a composition element of the oxide semiconductor film, a composition element of a part of the source/drain electrode in contact with the oxide semiconductor film, and at least either fluorine or chlorine in a part of the oxide semiconductor film where the source/drain electrode is not superimposed (e.g., the oxide semiconductor film between the source electrode and the drain electrode constituting the source/drain electrode).

Supplementary Note 16

Third Exemplary Embodiment, FIG. 5

The thin film device manufacturing method as depicted in Supplementary Note 14 or 15, which, when forming the source/drain electrode on the oxide semiconductor film, deposits the metal layer to be the source/drain electrode on the oxide semiconductor film, selectively performs plasma etching of the metal layer by using at least either a fluorine-based gas or a chlorine-based gas thereby to form the surface layer in a part of the oxide semiconductor film where the source/drain electrode is not superimposed (e.g., the oxide semiconductor film between the source electrode and the drain electrode constituting the source/drain electrode) and to form a mixed layer containing a mixture of the composition element of the oxide semiconductor film and the composition element of a part of the source/drain electrode in contact with the oxide semiconductor film in an interface between the oxide semiconductor film and the source/drain electrode.

Supplementary Note 17

Fourth Exemplary Embodiment, FIG. 6

A thin film device manufacturing method which includes: forming a gate electrode on a substrate; forming a gate insulating film on the gate electrode; forming an oxide semiconductor film on the gate insulating film; and performing plasma processing on the surface of the oxide semiconductor film by using at least either a fluorine-based gas or a chlorine-based gas thereby to form a surface layer containing at least either fluorine or chlorine on the entire surface of the oxide semiconductor film, to form a channel protection insulating film on a part of the surface layer, and to form the source/drain electrode on the surface layer and the channel protection insulating film.

Supplementary Note 18

Fifth Exemplary Embodiment, FIG. 7

The thin film device manufacturing method as depicted in Supplementary Note 17, which, when forming the source/drain electrode on the surface layer and the channel protection insulating film, deposits a metal layer to be the source/drain electrode on a part of the surface layer not covered by the channel protection insulating film and on the channel protection insulating film, and selectively performs plasma etching of the metal layer thereby to replace the surface layer between the oxide semiconductor film and the source/drain electrode with a mixed layer containing a mixture of the composition element of the surface layer (the composition element of the oxide semiconductor film and at least either fluorine or chlorine) and the composition element of a part of the source/drain electrode in contact with the surface layer.

Supplementary Note 19

Sixth Exemplary Embodiment, FIG. 8

A thin film device manufacturing method which includes: forming a gate electrode on a substrate; forming a gate insulating film on the gate electrode; forming an oxide semiconductor film on the gate insulating film; forming the source/drain electrode on the oxide semiconductor film; and forming a mixed layer containing a mixture of the composition element of the oxide semiconductor film and the composition element of a part of the source/drain electrode in contact with the oxide semiconductor film in an interface between the oxide semiconductor film and the source/drain electrode, wherein the mixed layer is formed in such a manner that the number of atoms of composition elements of the mixed layer changes from the source/drain electrode side towards the oxide semiconductor film side.

Supplementary Note 21

A bottom-gate type TFT which includes a gate electrode, a gate insulating film, an island-shaped oxide semiconductor film, and a source/drain electrode formed on a substrate in this order, wherein a surface layer containing fluorine or chlorine is provided in the vicinity of a top face (a surface on the opposite side of the side in contact with the gate insulating film) of the island-shaped oxide semiconductor film in a part where the source/drain electrode is not superimposed.

Supplementary Note 22

The TFT as depicted in Supplementary Note 21, wherein the composition element of the surface layer is constituted with the composition element of the island-shaped oxide semiconductor film, the composition element of the source/drain electrode in the part in contact with the island-shaped oxide semiconductor film, and fluorine or chlorine.

Supplementary Note 23

The TFT as depicted in Supplementary Note 22, wherein a mixed layer containing a mixture of the composition element of the island-shaped oxide semiconductor film and the composition element of a part of the source/drain electrode in contact with the oxide semiconductor film exists in an interface between the island-shaped oxide semiconductor film and the source/drain electrode.

Supplementary Note 24

A bottom-gate type TFT which includes a gate electrode, a gate insulating film, an island-shaped oxide semiconductor film, a channel protection insulating film, and a source/drain electrode formed on a substrate in this order, wherein a surface layer containing fluorine or chlorine is provided in the vicinity of a top face (a surface on the opposite side of the side in contact with the gate insulating film) of the island-shaped oxide semiconductor film.

Supplementary Note 25

The TFT as depicted in Supplementary Note 24, wherein a mixed layer containing a mixture of the composition element of the island-shaped oxide semiconductor film, the composition element of the part of the source/drain electrode in contact with the oxide semiconductor film, and fluorine or chlorine exists in an interface between the island-shaped oxide semiconductor film and the source/drain electrode.

Supplementary Note 26

The TFT as depicted in any one of Supplementary Notes 21 to 25, wherein the island-shaped oxide semiconductor film contains indium or zinc.

Supplementary Note 27

The TFT as depicted in any one of Supplementary Notes 21 to 26, wherein the proportion of the number of atoms of fluorine or the number of atoms of chlorine of the surface layer is between 0.1% and 73%, inclusive.

Supplementary Note 28

The TFT as depicted in any one of Supplementary Notes 21 to 27, wherein the part of the source/drain electrode in contact with the island-shaped oxide semiconductor film is titanium or molybdenum.

Supplementary Note 29

The TFT as depicted in Supplementary Note 21, 22, 23 or 28, wherein: the composition elements of the surface layer are indium, gallium, zinc, oxygen, titanium, and fluorine or chlorine; and the composition elements of the mixed layer are indium, gallium, zinc, oxygen, and titanium.

Supplementary Note 30

The TFT as depicted in Supplementary Note 21, 22, 23 or 28, wherein: the composition elements of the surface layer are indium, gallium, zinc, oxygen, molybdenum, and fluorine or chlorine; and the composition elements of the mixed layer are indium, gallium, zinc, oxygen, and molybdenum.

Supplementary Note 31

The TFT as depicted in Supplementary Note 24 or 25, wherein: the composition elements of the surface layer are indium, gallium, zinc, oxygen, and fluorine or chlorine; and the composition elements of the mixed layer are indium, gallium, zinc, oxygen, titanium, and fluorine or chlorine.

Supplementary Note 32

The TFT as depicted in Supplementary Note 24 or 25, wherein: the composition elements of the surface layer are indium, gallium, zinc, oxygen, and fluorine or chlorine; and the composition elements of the mixed layer are indium, gallium, zinc, oxygen, molybdenum, and fluorine or chlorine.

Supplementary Note 33

A bottom-gate type TFT which includes a gate electrode, a gate insulating film, an island-shaped oxide semiconductor film, and a source/drain electrode formed on a substrate in this order or a bottom-gate type TFT which includes a gate electrode, a gate insulating film, an island-shaped oxide semiconductor film, a channel protection insulating film, and a source/drain electrode formed on a substrate in this order, wherein: a mixed layer containing a mixture of the composition element of the oxide semiconductor film and the composition element of the source/drain electrode exists in an interface between the oxide semiconductor film and the source/drain electrode; and the number of atoms of composition elements of the mixed layer changes from the source/drain electrode side towards the oxide semiconductor film side.

Supplementary Note 34

The TFT as depicted in Supplementary Note 33, wherein the oxide semiconductor film contains indium or zinc.

Supplementary Note 35

The TFT as depicted in Supplementary Note 33 or 34, wherein the material of a part of the source/drain electrode in contact with the oxide semiconductor film is titanium or molybdenum.

Supplementary Note 36

The TFT as depicted in any one of Supplementary Notes 33 to 35, wherein: the composition elements of the mixed layer are indium, gallium, zinc, oxygen, and titanium; and the number of atoms of titanium in the mixed layer decreases from the source/drain electrode side towards the oxide semiconductor film side, and the number of atoms of indium or zinc in the mixed layer increases from the source/drain electrode side towards the oxide semiconductor film side.

Supplementary Note 37

The TFT as depicted in any one of Supplementary Notes 33 to 35, wherein: the composition elements of the mixed layer are indium, gallium, zinc, oxygen, and molybdenum; and the number of atoms of molybdenum in the mixed layer decreases from the source/drain electrode side towards the oxide semiconductor film side, and the number of atoms of indium in the mixed layer increases from the source/drain electrode side towards the oxide semiconductor film side. The possibilities of industrial use of the present invention may be pixel drive elements of flat panel displays such as a liquid crystal display, an organic EL display, and an electronic paper. In particular, through controlling the oxide semiconductor surface layer by using the present invention, it is possible acquire a TFT in which the electric characteristics such as the off-current and the threshold voltage are more minutely controlled compared to the case of the related techniques using the oxide semiconductor. Therefore, the present invention can be utilized not only for the pixel drive element but also for a high-performance circuit such as a logic circuit formed by having an inverter as the base.

Furthermore, the present invention can be used not only for the display as described above but also for high pressure-resistance power device which utilizes a high drain pressure-resistance of the TFT and to a thermoelectric conversion device which utilizes a high thermoelectromotive power of the oxide semiconductor film.

What is claimed is:

1. A thin film device, comprising a gate electrode on a substrate, a gate insulating film on the gate electrode, an oxide semiconductor film on the gate insulating film, and a source/drain electrode on the oxide semiconductor film, wherein
a surface layer contains a composition element of the oxide semiconductor film, a composition element of a part of the source/drain electrode in contact with the oxide semiconductor film, and at least either fluorine or chlorine exist in a part of the oxide semiconductor film where the source/drain electrode is not superimposed.

2. A thin film device, comprising a gate electrode on a substrate, a gate insulating film on the gate electrode, an oxide semiconductor film on the gate insulating film, and a source/drain electrode on the oxide semiconductor film, wherein
a surface layer containing at least either fluorine or chlorine exists in a part of the oxide semiconductor film where the source/drain electrode is not superimposed, and
a mixed layer containing a mixture of the composition element of the oxide semiconductor film and the composition element of the part of the source/drain electrode in contact with the oxide semiconductor film exists in an interface between the oxide semiconductor film and the source/drain electrode.

3. A thin film device, comprising a gate electrode on a substrate, a gate insulating film on the gate electrode, an oxide semiconductor film on the gate insulating film, and a source/drain electrode on the oxide semiconductor film, wherein
 a surface layer containing at least either fluorine or chlorine exists in a part of the oxide semiconductor film where the source/drain electrode is not superimposed,
 the thin film device further comprises a channel protection insulating film on the surface layer, and
 the surface layer also exists in a part of the oxide semiconductor film where the source/drain electrode is superimposed.

4. The thin film device as claimed in claim 3, wherein a mixed layer constituted with a mixture of the composition element of the oxide semiconductor film, the composition element of the part of the source/drain electrode in contact with the oxide semiconductor film, and at least either fluorine or chlorine exists in an interface between the oxide semiconductor film and the source/drain electrode.

5. A thin film device, comprising a gate electrode on a substrate, a gate insulating film on the gate electrode, an oxide semiconductor film on the gate insulating film, and a source/drain electrode on the oxide semiconductor film, wherein:
 a mixed layer containing a mixture of a first composition element of the oxide semiconductor film and a second composition element of a part of the source/drain electrode in contact with the oxide semiconductor film exists in an interface between the oxide semiconductor film and the source/drain electrode; and
 a quantity of atoms of the first and second composition elements of the mixed layer changes from the source/drain electrode side towards the oxide semiconductor film side.

6. The thin film device as claimed in claim 2, wherein:
 the surface layer contains indium, gallium, zinc, oxygen, titanium, and at least either fluorine or chlorine; and
 the mixed layer contains indium, gallium, zinc, oxygen, and titanium.

7. The thin film device as claimed in claim 4, wherein:
 the surface layer contains indium, gallium, zinc, oxygen, and at least either fluorine or chlorine; and
 the mixed layer contains indium, gallium, zinc, oxygen, titanium, and at least either fluorine or chlorine.

8. The thin film device as claimed in claim 2, wherein:
 the surface layer contains indium, gallium, zinc, oxygen, molybdenum, and at least either fluorine or chlorine; and
 the mixed layer contains indium, gallium, zinc, oxygen, and molybdenum.

9. The thin film device as claimed in claim 4, wherein:
 the surface layer contains indium, gallium, zinc, oxygen, and at least either fluorine or chlorine; and
 the mixed layer contains indium, gallium, zinc, oxygen, molybdenum, and at least either fluorine or chlorine.

10. The thin film device as claimed in claim 5, wherein:
 the mixed layer contains indium, gallium, zinc, oxygen, and titanium; and
 a quantity of atoms of titanium of the mixed layer decreases from the source/drain electrode side towards the oxide semiconductor film side, and a quantity of atoms of indium or zinc of the mixed layer increases from the source/drain electrode side towards the oxide semiconductor film side.

11. The thin film device as claimed in claim 5, wherein:
 the mixed layer contains indium, gallium, zinc, oxygen, and molybdenum; and
 a quantity of atoms of molybdenum of the mixed layer decreases from the source/drain electrode side towards the oxide semiconductor film side, and a quantity of atoms of indium or zinc of the mixed layer increases from the source/drain electrode side towards the oxide semiconductor film side.

12. The thin film device as claimed in claim 1, wherein the oxide semiconductor film contains at least either indium or zinc.

13. The thin film device as claimed in claim 1, wherein a proportion of the number of atoms of fluorine or the number of atoms of chlorine of the surface layer is between 0.1% and 73%, inclusive.

14. The thin film device as claimed in claim 1, wherein the part of the source/drain electrode in contact with the oxide semiconductor film contains at least titanium or molybdenum.

* * * * *